(12) United States Patent
Murtuza et al.

(10) Patent No.: US 11,502,030 B2
(45) Date of Patent: Nov. 15, 2022

(54) SYSTEM AND METHOD OF ASSEMBLING A SYSTEM

(71) Applicant: OCTAVO SYSTEMS LLC, Sugar Land, TX (US)

(72) Inventors: Masood Murtuza, Sugar Land, TX (US); Erik James Welsh, Bellaire, TX (US); Peter Linder, Sugar Land, TX (US); Gene Alan Frantz, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 271 days.

(21) Appl. No.: 16/330,007

(22) PCT Filed: Aug. 31, 2017

(86) PCT No.: PCT/US2017/049611
§ 371 (c)(1),
(2) Date: Mar. 1, 2019

(87) PCT Pub. No.: WO2018/045167
PCT Pub. Date: Mar. 8, 2018

(65) Prior Publication Data
US 2019/0206779 A1    Jul. 4, 2019

Related U.S. Application Data

(60) Provisional application No. 62/383,138, filed on Sep. 2, 2016.

(51) Int. Cl.
*H05K 1/11* (2006.01)
*H01L 23/498* (2006.01)
(Continued)

(52) U.S. Cl.
CPC .... *H01L 23/49833* (2013.01); *H01L 23/3107* (2013.01); *H01L 23/481* (2013.01);
(Continued)

(58) Field of Classification Search
CPC ... H05K 1/11; H05K 1/14; H05K 1/18; H05K 1/181–187; H01L 23/48; H01L 23/498;
(Continued)

(56) References Cited

U.S. PATENT DOCUMENTS

| | | | |
|---|---|---|---|
| 5,814,847 A * | 9/1998 | Shihadeh | H01L 23/5382 257/208 |
| 8,680,691 B2 * | 3/2014 | Kariyazaki | H01L 23/49838 257/773 |

(Continued)

FOREIGN PATENT DOCUMENTS

WO    2016025693 A1    2/2016

OTHER PUBLICATIONS

International Search Report and Written Opinion issued in corresponding International Application No. PCT/US2017/049611, dated Dec. 27, 2017, 10 pages.

*Primary Examiner* — Tuan T Dinh
(74) *Attorney, Agent, or Firm* — Rothwell, Figg, Ernst & Manbeck, P.C.

(57) ABSTRACT

A substrate for a SIP is that has a portion of its top surface covered with spaced apart electrically conductive landing pads for electrical connection to components located on the surface and the landing pads serve as interconnection pads for making electrical connections between at least a portion of said pads when interconnected by a segment of bond wire to form at least a portion of the SIP. Methods for use of the universal substrate in SIP system design and manufacture of a SIP.

14 Claims, 16 Drawing Sheets

(51) Int. Cl.
- *H01L 25/16* (2006.01)
- *H01L 23/538* (2006.01)
- *H01L 23/31* (2006.01)
- *H01L 23/48* (2006.01)
- *H01L 23/495* (2006.01)
- *H01L 23/00* (2006.01)
- *H05K 1/18* (2006.01)
- *H01L 25/065* (2006.01)

(52) U.S. Cl.
CPC .. *H01L 23/49513* (2013.01); *H01L 23/49838* (2013.01); *H01L 23/5386* (2013.01); *H01L 24/14* (2013.01); *H01L 24/49* (2013.01); *H01L 25/16* (2013.01); *H05K 1/111* (2013.01); *H05K 1/181* (2013.01); *H01L 23/5385* (2013.01); *H01L 25/0655* (2013.01); *H01L 2224/04042* (2013.01); *H01L 2224/48157* (2013.01); *H01L 2224/48227* (2013.01); *H01L 2224/73265* (2013.01); *H01L 2924/14* (2013.01); *H01L 2924/1436* (2013.01); *H01L 2924/14511* (2013.01); *H01L 2924/15192* (2013.01); *H01L 2924/15311* (2013.01); *H01L 2924/19042* (2013.01); *H01L 2924/19105* (2013.01); *H01L 2924/19107* (2013.01)

(58) Field of Classification Search
CPC ............. H01L 23/49833; H01L 23/481; H01L 23/49838; H01L 23/49513; H01L 23/5386; H01L 25/16; H01L 24/14; H01L 24/49
USPC .......................................... 361/760–777, 803
See application file for complete search history.

(56) References Cited

U.S. PATENT DOCUMENTS

| | | | |
|---|---|---|---|
| 8,791,015 B2* | 7/2014 | Pagaila | H01L 21/3205 438/667 |
| 2005/0003583 A1* | 1/2005 | Keating | H01L 21/561 257/E23.126 |
| 2007/0252255 A1* | 11/2007 | Lam | H01L 21/6835 257/E25.023 |
| 2008/0147350 A1* | 6/2008 | Jean | G06F 3/01 702/150 |
| 2008/0290486 A1 | 11/2008 | Chen et al. | |
| 2009/0115026 A1* | 5/2009 | Gerber | H01L 23/481 257/621 |
| 2009/0278245 A1 | 11/2009 | Bonifield et al. | |
| 2009/0303128 A1* | 12/2009 | Robert | H01Q 9/0407 342/373 |
| 2010/0052135 A1 | 3/2010 | Shim et al. | |
| 2010/0330742 A1* | 12/2010 | Sugiyama | H01L 25/16 438/107 |
| 2011/0233753 A1 | 9/2011 | Camacho et al. | |
| 2012/0111606 A1* | 5/2012 | Mauclerc | H01L 23/49838 174/250 |
| 2014/0376202 A1* | 12/2014 | Shibutani | H01L 23/49811 361/767 |
| 2016/0143140 A1* | 5/2016 | Chang | H05K 1/05 174/262 |
| 2016/0181195 A1* | 6/2016 | Kim | H01L 23/49816 257/668 |
| 2017/0287885 A1* | 10/2017 | Murtuza | H01L 25/50 |
| 2019/0074268 A1* | 3/2019 | Murtuza | H05K 1/0286 |

* cited by examiner

SYSTEM AND METHOD OF ASSEMBLING A SYSTEM

CROSS REFERENCE TO RELATED APPLICATION(S)

This application is a 35 U.S.C. § 371 National Stage of International Patent Application No. PCT/US2017/049611, filed Aug. 31, 2017, designating the United States, which claims the benefit of U.S. Provisional Application No. 62/383,138, which was filed Sep. 2, 2016, the disclosures of which are incorporated herein in their entirety by reference.

TECHNICAL FIELD

This disclosure relates to a substrate for electronic devices, such as System in a Package (SIP) devices.

BACKGROUND

System-on-a-Chip ("SoC") often refers to a device used in the semiconductor industry that incorporates different functional circuit blocks on a single monolithic block of silicon to form one system circuit. System in a Package (SIP) devices can be used, for instance in the semiconductor industry, to assemble multiple integrated circuits, other devices, and passive components in one package. A application, PCT/US2015/045022, which was filed Aug. 13, 2015, and is titled Improved Substrate for System In Package (SIP) Devices, is directed to a new, simplified SIP design. There remains a need, however, for substrates that can be used in SIP devices with maximum system flexibility to achieve increased production efficiencies.

SUMMARY

SIPs enable integration of devices with diverse device fabrication technologies such as digital, analog, memories and other devices and components such as discrete circuits, devices, sensors, power management, and other SIPs that are otherwise impossible or impractical to integrate in a single silicon circuit like an ASIC or SoC. These other discrete circuits may include non-silicon based circuits, such as organic, germanium, or GAN. SIPs are also attractive because they allow miniaturization of microelectronic systems from a printed circuit board tens of square cm in size to typically a single package a few square cm or less. Another benefit of a SIP is that it allows for the building of prototypes to test a system prior to further integration of some or all of the components into a single monolithic silicon circuit to produce a SoC.

Aspects of the present disclosure allow for simplification of system design by avoiding the need for a unique printed circuit board design for each system, and by potentially reducing the number of layers in a substrate (e.g., a printed circuit board) used in a SIP. In some embodiments, the substrate may include a conductive layer on the top surface of a base layer, but no additional conductive layers below. Additionally, embodiments include the re-use of a single, universal substrate as a common component in multiple different SIP systems.

In some embodiments, a universal substrate includes an array or matrix of spaced apart conductive connection pads covering a portion of the substrate surface, and may in some instances, cover substantially all of a substrate surface area. The conductive pads may serve, for example, as a universal connection matrix. In some embodiments, the pads are generic connection pads so that one or more bond wire connections may be used to electrically connect selected pads together and to connect to components, including both active and passive components, mounted on the substrate.

According to some embodiments, the use of such substrates allows unique systems to be created on a single, common substrate. For example, by programming the connections of the matrix connection pads on a universal substrate differently via different bond wire connections for different systems, even when using the same components and hardware, different systems can be assembled. In some embodiments, other hardware methods, such as printed conductors, may be employed to electrically connect pads to accomplish the programming, or be used in addition to bond wires. In certain aspects, switches or zero ohm resistors may be used to program a portion of a system on a universal substrate; such switches may be, for example, but not limited to, analog or digital switches, FPGAs, or semiconductor switches.

In some embodiments, the use of a common or standard substrate for a family of similar systems using a SIP assembly process is provided. The required system customization, which can be defined by a system's unique interconnecting scheme or design, is done during assembly by creating appropriate electrical connections or "links" with bond wire, or other electrically connective means, between pads that constitute a universal connection matrix that are strategically placed on a portion of the surface of the common substrate. These pads may be connected together for the purpose of being able to make multiple, different, and unique customized link patterns depending upon the electrical components used in a system and that system's desired application(s). These links may be changed as required by a system's design just prior to assembly.

In some embodiments, the common universal substrate may also, optionally, have multiple metal layers for interconnection of different circuits and/or components, in addition to the bond wires on the surface, to handle power rails and other common interconnections, so that changeable interconnections may be on the surface and fixed interconnections may be embedded in the layers of the substrate. For some implementations, the surface links may act as additional layers of the substrate, thus reducing the number of metal layers within a substrate. The links provide the flexibility to configure or program a common substrate to create multiple different systems using the universal connection matrix on the common substrate as a function of the components installed on that common substrate in addition to any other devices and/or components that are included in the SIP (for new system functionality).

In certain aspects, multiple embodiments of a universal connection matrix are provided. For instance, embodiments include a substrate that has a majority of its surface covered with spaced apart landing pads on which components are mounted, and may or may not include additional substrate layers below the surface layer. In some embodiments, a substrate having additional substrate layers below the surface layer, conventional component mounting areas on that surface layer, and a portion of the substrate surface layer covered with a matrix of spaced apart landing pads is provided. In some instance, the pads may be at least partially connected with the substrate layers. Another embodiment includes a conventional first substrate having at least one substrate layer below the surface layer, conventional component mounting areas on that surface layer, and a second substrate having at least a portion of its surface covered with a matrix of spaced apart landing pads that is mounted on the first substrate as a component and may be at least partially operatively interconnected with the first substrate.

Some embodiments provide methods for the use of a universal substrate in a SIP system design and the manufacture of the resulting SIP. In one example, a method begins with a description of a system. The "system description" or design may be, for instance, in the form of a schematic, net list or other format which completely describes the SIP system in addition the universal substrate portion of the system. Using a universal substrate as disclosed herein, the various components to be placed on the universal substrate can be determined and then selectively placed on it. These components may include active, passive, silicon based and/or non-silicon based devices. In some embodiments, once the components are selectively placed or mounted, the components are electrically interconnected, for example, but not limited to, using bond wires attached to the appropriate landing pads in the array of pads on the surface of the universal substrate. Other methods of electrical interconnections may be used other than wire bonds, or in combination with wire bonds. In some instances, the components are at least partially connected to external connectors, like pins or balls on the package of a SIP, to conform to the original "system description" for the SIP.

According to some embodiments, a substrate is provided. The substrate may include a base layer and a connection matrix on its surface, for instance, on the top surface of the base layer. The connection matrix may comprise a plurality of individually isolated and spaced apart electrically conductive pads arranged to provide electrical connections for components mounted on the pads and to allow electrical interconnections between at least a first and second of the pads of the connection matrix. The substrate may also include one or more external connection elements. They may be located, for instance, along an outside edge of the substrate. They may also include a ball grid array. In some embodiments, the connection matrix covers a majority of the surface of the base layer. For example, the connection matrix can cover at least 75% of the top surface of the base layer. In certain aspects, the connection matrix is the only conductive layer of the substrate.

According to some embodiments, a substrate is provided with first and second groups of conductive pads. For instance, the substrate can include a base layer, a first plurality of individually isolated and spaced apart electrically conductive pads arranged in a first group on a surface of the base layer for mounting individual components on the first plurality of pads, and a second plurality of individually isolated and spaced apart electrically conductive pads arranged in a second group on the surface for mounting individual components on the second plurality of pads. The substrate may further include an outer perimeter portion of individually isolated and spaced apart electrically conductive pads on the surface for at least making electrical connections, one or more signal trace lines on the surface separating the first and second groups and connecting to the outer perimeter portion, and one or more insulating areas on the surface separating the outer perimeter portion and the first and second groups.

According to some embodiments, a system, such as a SIP, is provided. The system includes a first substrate having a top surface, a first connection matrix on the top surface, wherein the first connection matrix comprises a plurality of individually isolated and spaced apart electrically conductive pads, one or more circuit components mounted on at least a first of the pads, and one or more bond wires that provide electrical connections between at least the first pad and a second of the pads. According to some embodiments, the first connection matrix covers a majority of the top surface of the first substrate. Additionally, in certain aspects, the first substrate can be electrically connected to and mounted on a second substrate. In some embodiments, the second substrate comprises a second connection matrix comprising a plurality of individually isolated and spaced apart electrically conductive pads, where the first substrate is electrically connected to and mounted on the second substrate using the second connection matrix. In certain aspects, the system is a SIP and further comprises an encapsulant layer.

According to some embodiments, a method for assembling a system is provided. The method includes selecting a substrate for the system, where the substrate comprises a connection matrix of a plurality of spaced apart individual electrically conductive pads on a top surface of the substrate; installing a first set of components for the system on the pads of the connection matrix; and making electrical interconnections between two or more of the pads of the connection matrix. In some embodiments, the method further includes making electrical connections between at least one of the pads and one or more external connectors of the substrate. The method may also include installing a second set of components on areas on the top surface of the substrate that do not include the connection matrix and making operative electrical connections between the first and second set of components. In certain aspects, the system may be a SIP and the method may further include encapsulating the substrate.

According to some embodiments, a method for assembling a system is provided. The method includes selecting a first substrate for the system, where the first substrate comprises a connection matrix of a plurality of spaced apart individual electrically conductive pads on a surface of the substrate. This may cover, for instance, a majority of the top surface of the substrate. The method also includes installing a set of components for the system on the pads; making electrical interconnections between two or more of the pads; and making electrical connections between at least one of the pads and one or more external connectors of the substrate; and mounting the first substrate on a second substrate.

According to some embodiments, a method for assembling a SIP integrated circuit is provided. The method includes providing a first substrate comprising a connection matrix of a plurality of spaced apart individual electrically conductive pads on a top surface of said the substrate; placing a plurality of components on the pads of the connection matrix according to a system design; interconnecting the plurality of components using the pads of the matrix and one or more bond wires; and connecting the first substrate to a second substrate such that the plurality of components are electrically connected to the second substrate. The connection matrix may, for example, cover a majority of the top surface. In some embodiments, the method may further include selecting a system design having preselected components placements for the plurality of components, wherein the system design defines interconnections for the plurality of components to determine the functionality of the SIP. The method may also include encapsulating the first and second substrates together to form a package for the SIP. In certain aspects, placing a plurality of components on the pads of the connection matrix comprises applying a solder mask to the first substrate. In some embodiments, the second substrate comprises a connection matrix of a plurality of spaced apart individual electrically conductive pads on a top surface of the second substrate and the mounting includes mounting the first substrate to the connection matrix of the second substrate. The plurality of components and the connection matrix of the second substrate can be are electrically connect by one or more of bond wires and a ball grid array, for example.

These and other features of the disclosure will become apparent to those skilled in the art from the following detailed description of the disclosure, taken together with the accompanying drawings.

BRIEF DESCRIPTION OF THE DRAWINGS

Certain embodiments of the disclosure will be described with reference to the accompanying drawings. However, the accompanying drawings illustrate only certain aspects or implementations of the disclosure by way of example and are not meant to limit the scope of the claims.

DETAILED DESCRIPTION

Figure 1:
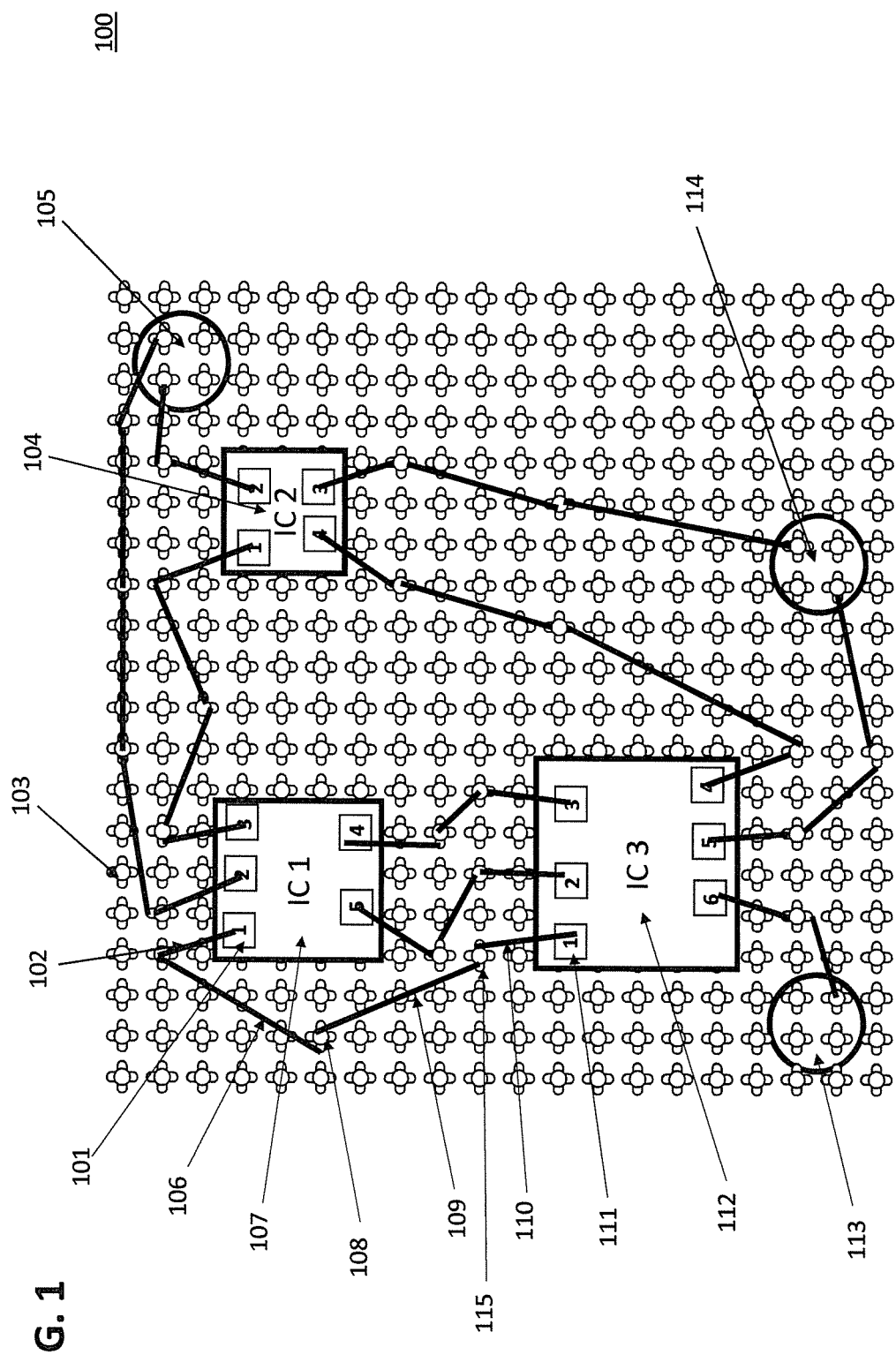
FIG. 1 is a diagram of a system according to some embodiments.

Referring now to FIG. 1, FIG. 1 depicts a system and substrate according to some embodiments. In the example of FIG. 1, a portion of a universal substrate 100 for use in a SIP is shown, along with a simple representative circuit, which illustrates how a system may be implemented on a universal substrate for use in a SIP according to certain aspects of the disclosure. In this example, the circuit has three integrated circuits (ICs) (or other components) 107, 104, and 112, which are located on the substrate 100. According to some embodiments, substantially the entire surface of the universal substrate 100 has an array of landing pads, with each landing pad in the shape of a plus sign, one of which is labelled 103. Although FIG. 1 depicts landing pads as crosses or plus signs, other shapes may be employed for such pads. Although FIG. 1 depicts landing pads on substantially the entire surface of the universal substrate 100, in some embodiments, the surface may be covered with a matrix of landing pads that do not cover the entire surface, but do cover at least a portion of the surface and provide a universal connection matrix made up of those pads.

In certain aspects, the universal substrate 100 may have multiple, insulatingly spaced apart, conductive layers which may be etched or otherwise created to provide electrical conductors in specific patterns of unique conductive routing lines or configurations within each conductive layer and vias for interconnections between layers and pads and/or components (referred to as "circuitization"). For example, such layers may be used as described with reference to FIG. 8. In some instances, these patterns may be used to at least partially interconnect the different components mounted on the universal substrate 100, and for some embodiments, to connect with portions of a SIP substrate on which the universal matrix 100 may be located. The operative connections used to make the components mounted on a substrate into a system, and perform the desired functionality of that system, can be made by electrical interconnections between components mounted on a substrate. These connections can use the conductive layers when those layers are present, component interconnections using landing pads, and pad and/or component interconnections with external connectors. That is, in some examples, interconnections are made in functional relationship to the components mounted on the substrate and the desire system functionality. For some embodiments, the universal substrate 100 of FIG. 1 may be a standalone substrate for use in a SIP, but having no sub-surface conductive layers. For other embodiments, the universal substrate has one or more surface portions populated with a matrix of pads, and the remainder of the substrate may be a conventional substrate.

In the example of FIG. 1, preselected clusters of landing pads that are electrically connected to power 114 and ground 105, 113 are depicted. Circuitization may be used to connect the power 114 and ground pads 105, 113 of the universal substrate to external connectors, like pins or balls of a final package. For other embodiments, the power and ground pads may be connected to the appropriate portions of a substrate that provide these services or functions via external connectors. For other embodiments, the universal substrate 100 may have only the surface layer with the landing pads on an insulating layer and all interconnections are made on the surface layer of the universal substrate; in certain aspects, these embodiments reduce the number of layers needed in a substrate. In embodiments where the universal substrate is a portion of a SIP substrate, interconnections between the universal substrate 100 and the SIP substrate may be made using bond wires, including, but not limited to, those for power and ground.

Further referring to FIG. 1, one interconnection path for the simple circuit is illustrated by a first pad 111 of the IC 112 being connected to another 101 of IC 107 using a series of interconnecting bond wires 110, 109, 106, 102 connected to the two pads, 111, 101 and interconnected using two landing pads in the array 115 and 108.

Figure 2:
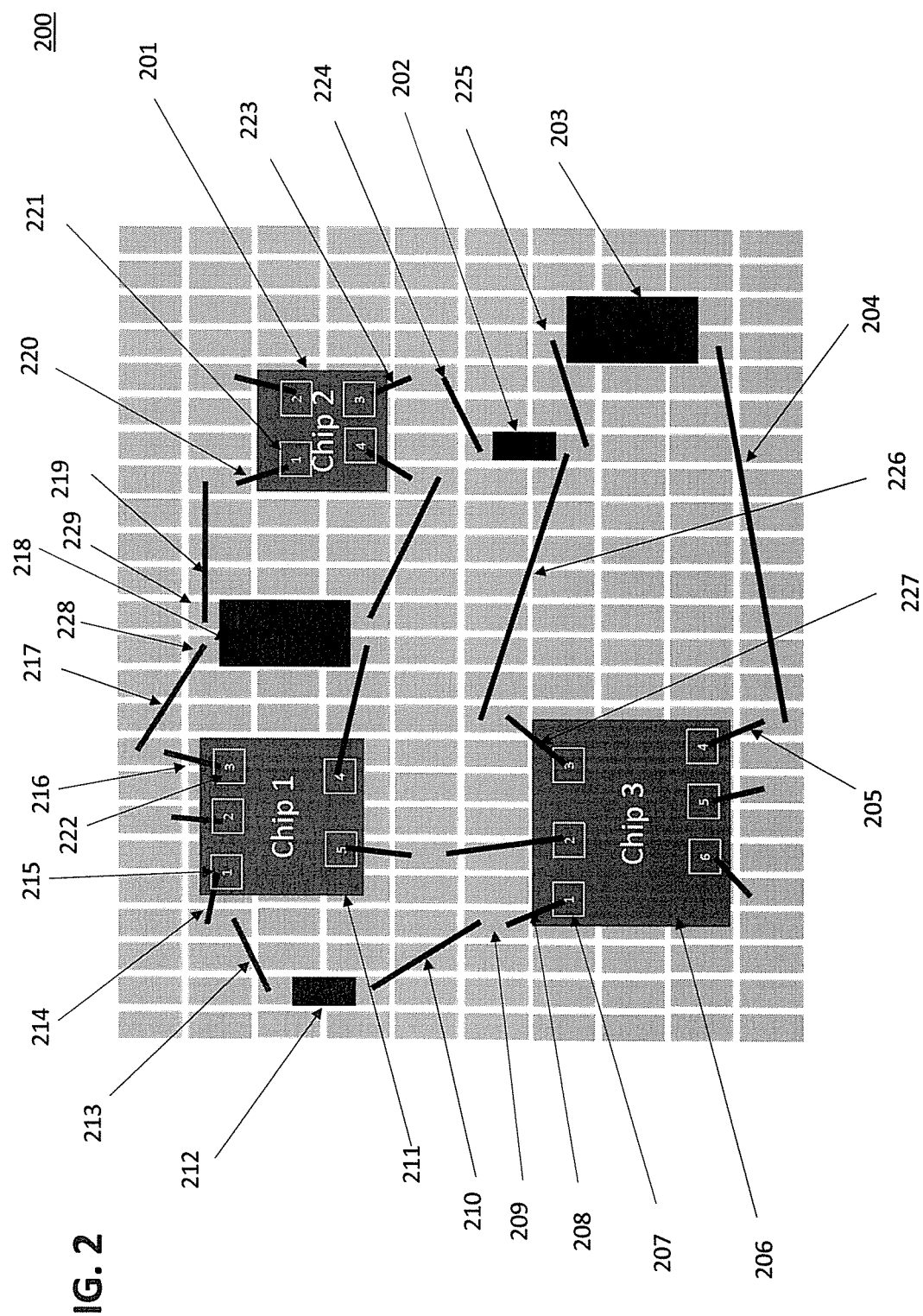
FIG. 2 is a diagram of a system according to some embodiments.

Referring now to FIG. 2, FIG. 2 depicts a portion of a universal substrate 200 for use in a SIP, according to some embodiments. In this example, a circuit is implemented on universal substrate 200. Substrate 200 includes rectangular shaped landing pads, one of which is labelled 209. Although FIG. 2 depicts landing pads as rectangular shapes, other shapes may be employed for such pads. According to some embodiments, the surface of substrate 200 is substantially entirely covered with landing pads. For instance, as shown in FIG. 2, more than 75% of the top surface of the substrate is covered with the connection matrix of landing pads. In the circuit of the example, in addition to the three chips 201, 206, 211, for instance, ICs, there are four passive devices 202, 203, 212, 218 for a total of seven components. An interconnection path, from pad 207 of chip 206 to pad 215 of chip 211 is also depicted in FIG. 2. In this example, a passive device 212 is in the interconnection path using bond wires 208, 210, 213, 214. Each bond wire is electrically connected to the next bond wire using landing pads, such as 209. That is, in this example, a pad of the connection matrix can serve as both a landing pad for mounting a device, as well as a connection pad to interconnect to another pad of the same matrix.

Another interconnection path for the circuit depicted in FIG. 2 includes passive component 218, which is connected to pad 222 of chip 211 and pad 221 of chip 201 using bond wires 216, 217, 219, 220 and selected landing pads. In this example, bond wires 217 and 219 are electrically connected as a result of passive 218 being soldered down to both landing pads 228 and 229. The other terminal of the passive component 218 is connected to pad "4" of chip 211 and pad "4" of chip 201 using bond wires and landing pads. There are two other interconnection paths for the circuit illustrated in FIG. 2 with passives 202, 203 connected to chips 201, 206 using bond wires 204, 205, 223, 224, 225, 226, 227 and selected landing pads.

Figure 3:
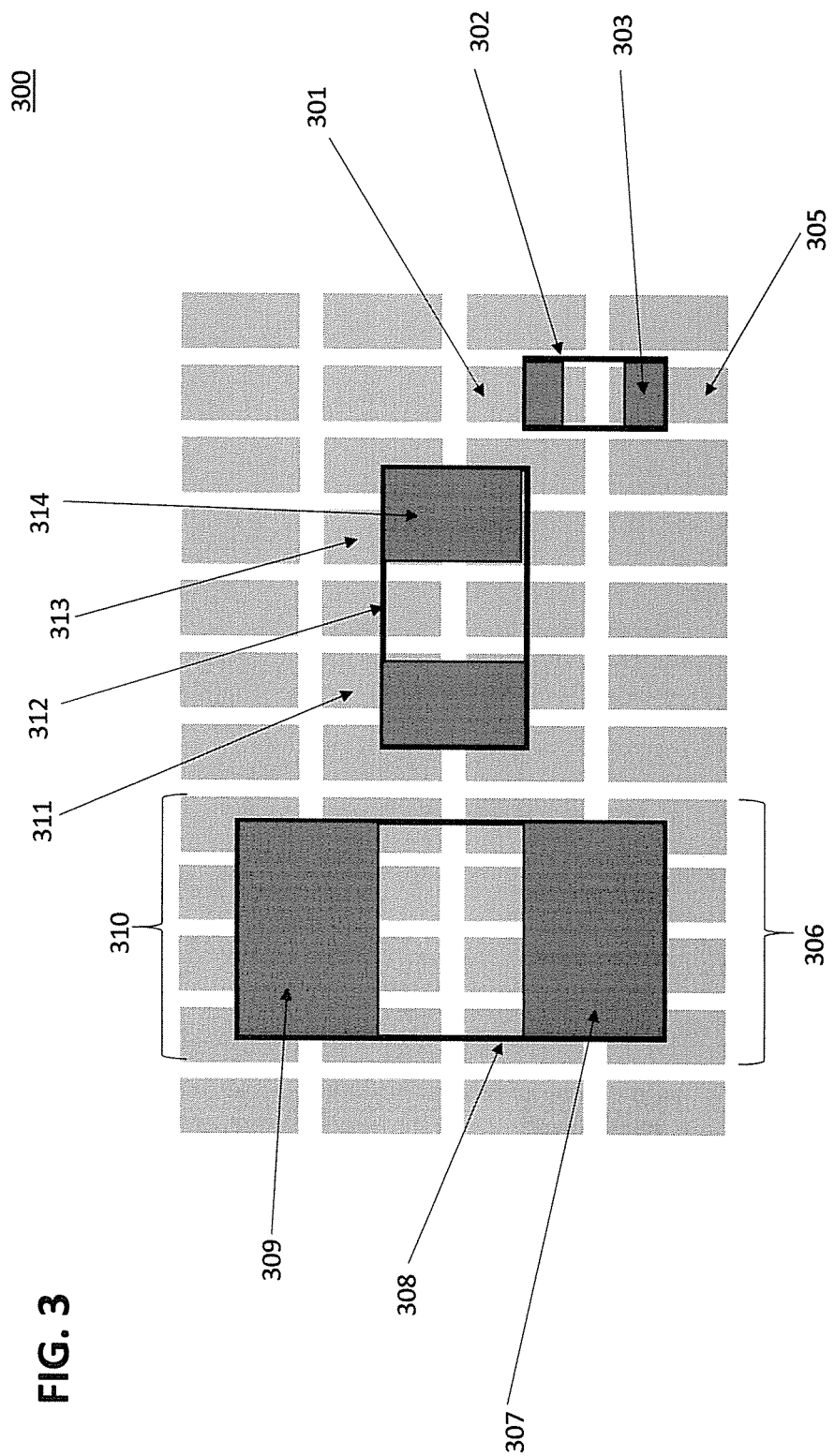
FIG. 3 is depicts a device arrangement according to some embodiments.

Referring now to FIG. 3, FIG. 3 illustrates an arrangement of devices on a universal substrate 300, which can be used, for example, in a SIP. In some embodiments, a number of devices, such as Surface Mounted Devices (SMDs), may be mounted and electrically connected to the universal substrate array 300. This can be done with the solder areas for an SMD (e.g., 307, 309, 314, 303) being attached to conductive landing pads such as 301, 305, 311, and 313. According to some embodiments, FIG. 3 depicts a small portion of the universal substrate 300. The three different sized SMD landing pads illustrated in FIG. 3 are representative of exemplary standard sized devices used in SIP products where the part designation describes the dimensions of the part in mils. For example, a part designated "0603" often indicates the dimensions of an SMD device to be 60 by 30 mils (1.5 by 0.75 mm). Although not necessarily to scale, FIG. 3 illustrates how different sized components, like a 0603 SMD 308, a 0402 SMD 312 and a 0201 SMD 302 would be mounted on, connected to and used on universal substrate 300. For example, the connection areas 307 and 309 between the 0603 SMD and the array 300 can be the landing pads 306 and 310, respectively. In this example, four landing pads are grouped together 306 and are electrically connected by the soldered area under the connection area 307. In the same manner, the other two sized SMDs 313, 302 illustrated in FIG. 3, are electrically connected to landing pads 311, 313, 301, 305 in the array through four solder connections of which two are 314 and 303.

Figure 4:
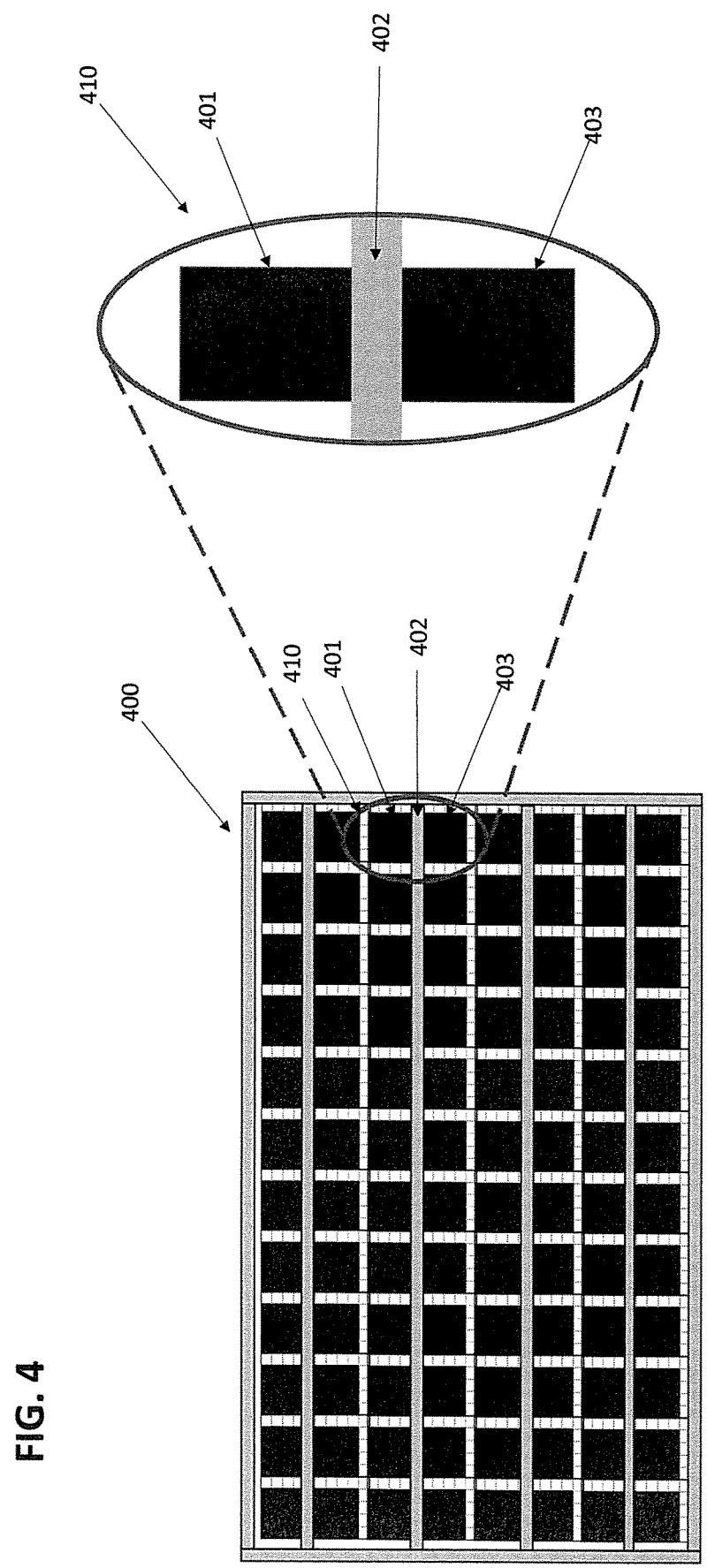
FIG. 4 is a diagram of a substrate according to some embodiments.

Referring now to FIG. 4, FIG. 4 depicts a portion of a universal substrate 400 for use in a SIP according to some embodiments. In this example, FIG. 4 shows a universal substrate array 400 with solder mask 402 placed over the array of landing pads, which covers at least a portion of the surface, or alternatively up to substantially the entire surface of the substrate. In certain aspects, the purpose of the solder mask 402 is to limit the solder and die attach material from extending beyond that portion of the pad which will be used to attach a SMD or die to the pad from that portion of the pad to which bond wires are to be attached. For instance, a landing pad 410 is illustrated, where the top half is 401 and the bottom half is 403, where 410 has a strip of solder mask 402 separating the two halves that make up the single pad. The solder mask performs the function of physically separating the area of a pad used for attaching an SMD and/or die from the area used for making wire bond attachments and connections.

According to certain aspects, a universal substrate, such as those described with respect to FIGS. 1-4, may be employed to create and customize a desired system on a SIP having desired functionalities. More particularly, the multiple components needed for a desired system may be mounted on a substrate of the present disclosure. The actual operative connections needed to cause the components on a substrate make up a system, and to perform the desired functionality of a that system, is made by the electrical or operative interconnections between components mounted on a substrate using conductive layers (when those layers are present), component interconnections using landing pads, and pad and/or component interconnections with system external connectors. The interconnections are made in functional relationship to the components mounted on the substrate and the desired system functionality using those components when operatively interconnected. In some examples, those components are operatively interconnected using bond wires or other direct connection means, and depending on the embodiment, link interconnections can be made in combination with circuitization.

Figure 5:
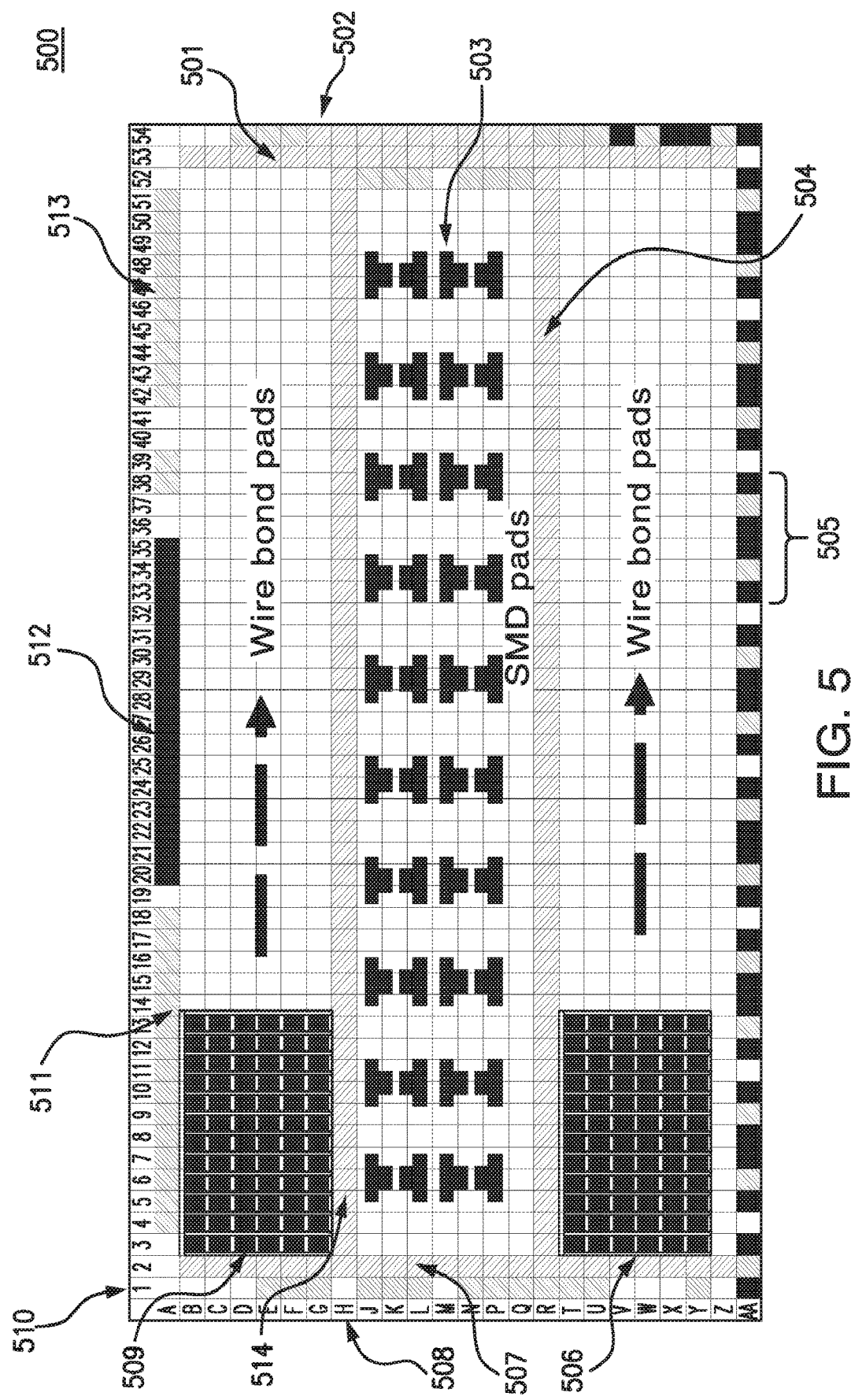
FIG. 5 is a diagram of a substrate according to some embodiments.

Referring now to FIG. 5, FIG. 5 depicts substrate 500 according to some embodiments, which can be used, for instance, in a SIP. FIG. 5 shows an example of a substrate 500 that may employ multiple shapes and types of landing pad arrays. In this example, the substrate 500 has three separated arrays of pads 503, 506, 509 on its surface. According to some embodiments, arrays 506 and 509 are made up of landing pads. These may be, for instance, an array of pads like those of FIGS. 2, 3 and/or 4. The array 503 may be, for instance, made to accept multiply sized SMD components. For instance, components like those illustrated with respect to FIG. 3. According to some embodiments, arrays 506 and 509 would cover an entire space as indicted by the dashed arrow in their respective locations of FIG. 5 (labeled "Wire bond pads").

According to some embodiments, the three arrays of FIG. 5 may be separated by signal trace channels 504, 514. Signal channels 504, 514 may be used to route input/output signals from one end of the array to the other end of the array on the substrate. In a similar manner, channels 501, 507 may be so employed. According to some embodiments, such input/output signals may be routed around the array using conductive layers beneath the surface layer on which the pads are located, and use of such layers allows for more pads to be located in the arrays. In the example of FIG. 5, around the periphery of the substrate are landing pads. The may be for power 505, ground 512, and signal inputs and outputs 502, 511, 513. The interconnection of the power, ground, and inputs and outputs with the individual pads of the three arrays may be made using circuitizations in the substrate or by using bond wires, or a combination of both. In certain aspects, the channels 504 and 514 may be used to route input and output signals from one side of the array to the other side, with signal channels 501 and 507 also being used to route signals. In this example, the location of each landing pad in the substrate array has a row identifier 508 and a column identifier 510.

Figure 6:
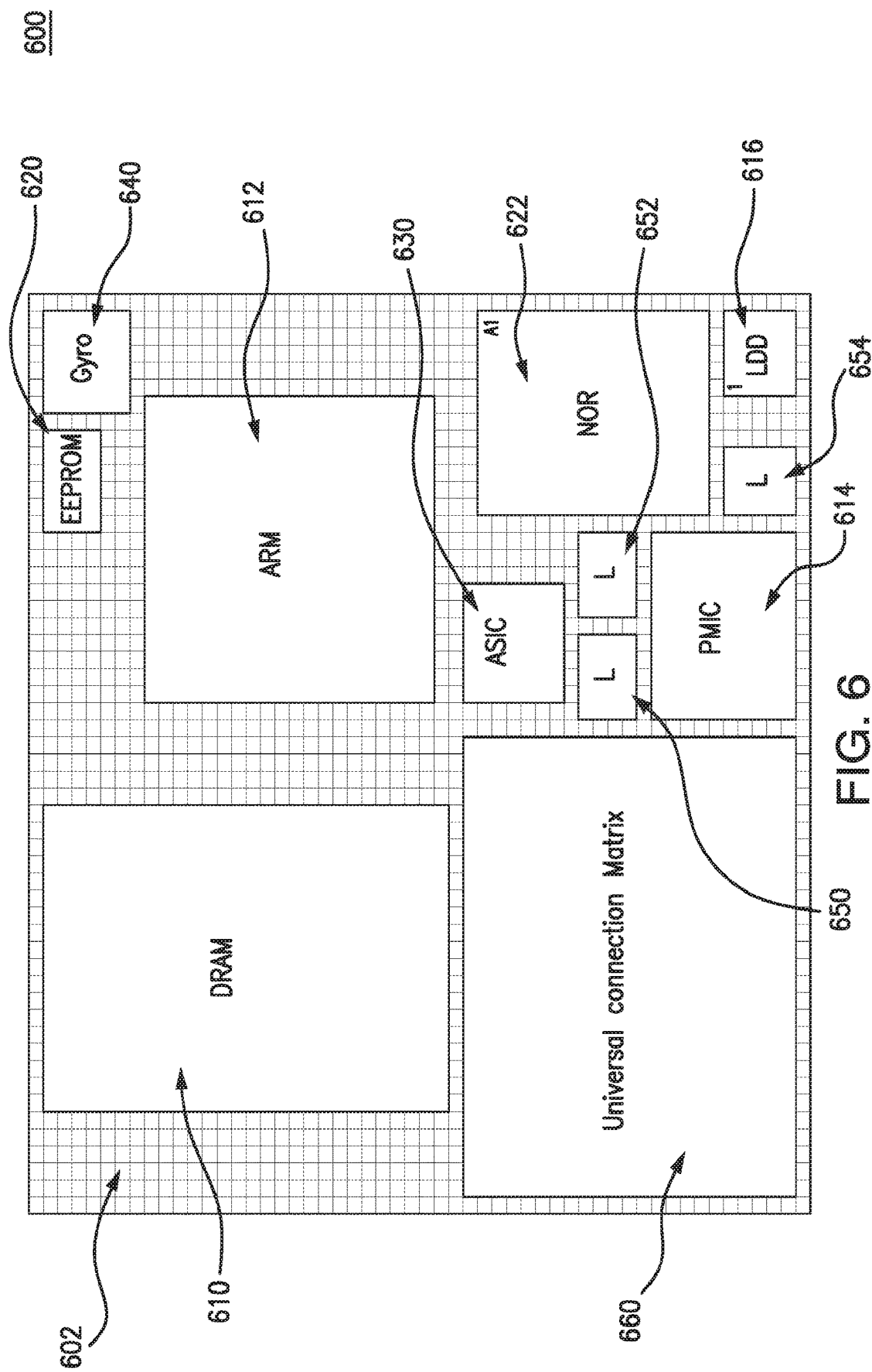
FIG. 6 is a diagram of a system according to some embodiments.

Referring now to FIG. 6, FIG. 6 depicts a system 600 using a substrate 602. The system may be, for instance, a SIP. In this example, the footprint of the system 600 with substrate 602 includes various components to be mounted thereon. Such components may be, by way of example, but not of limitation, a DRAM memory chip 610, an ARM CPU 612, a power management chip 614, an LDO chip 616, an EEPROM chip 620, a NOR memory chip 622, an ASIC 630, a gyro chip 640, and various passives 650, 652, 654. Each of these components may be in a packaged or die form. According to some embodiments, substrate 602 may include a universal connection matrix 660. In some embodiments, the matrix may be a part substrate 602; in some embodiments, it may be a separate component attached to substrate 602. In some embodiments, a universal connection matrix used with substrate 602 in FIG. 6 may be similar other substrates and arrays illustrated in FIGS. 1, 2, and/or 5. In certain aspects, the use of substrate 602 allows for maximum flexibility of component mountings and interconnections. Additionally, more than one such substrate may be employed in a SIP. That is, multiple subsystems such as system 600 may be interconnected and packaged to form a single SIP.

Figure 7A:
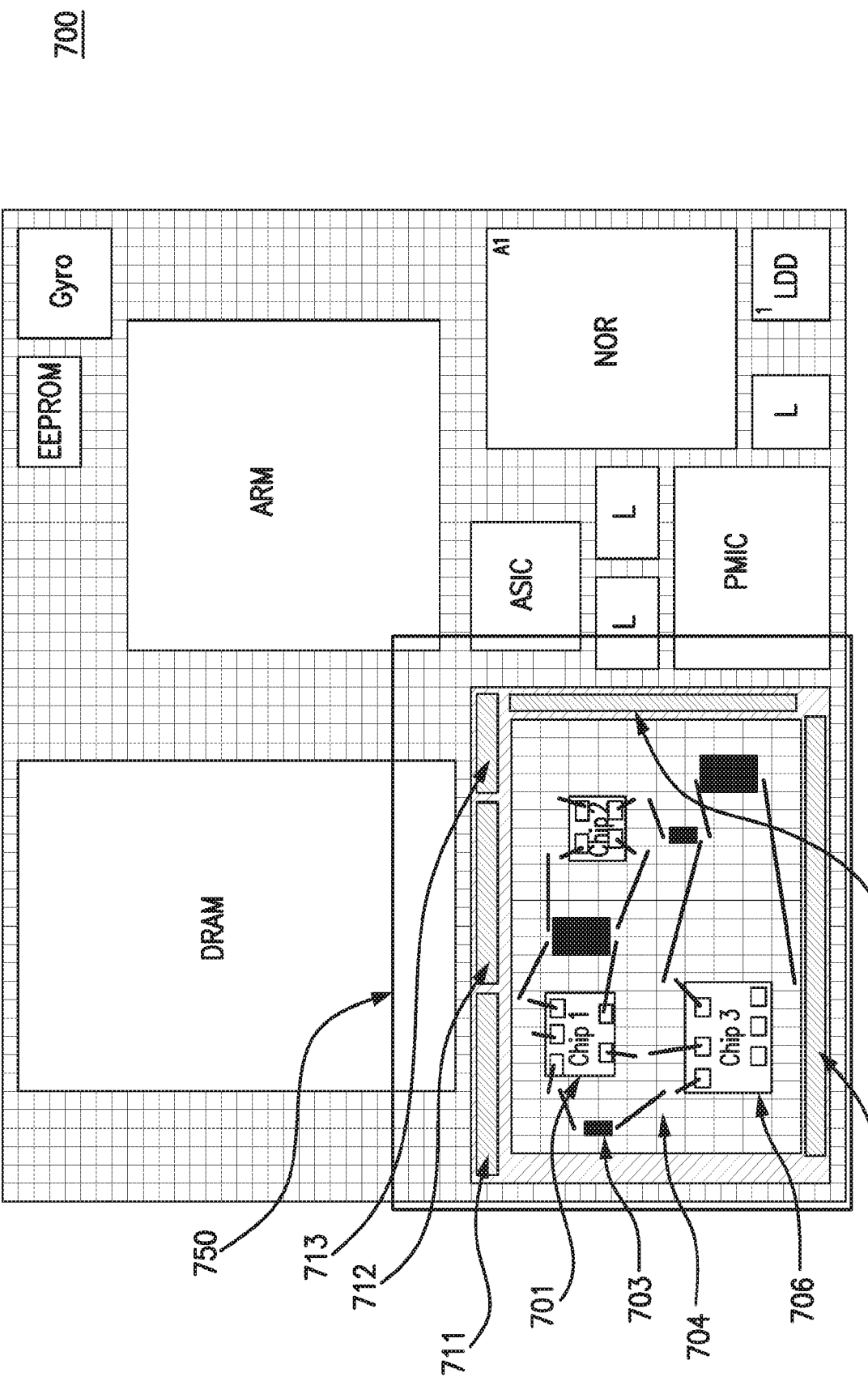
FIGS. 7A-7C depict a system according to some embodiments.

Referring now to FIG. 7A, FIG. 7A depicts a system 700, which may be, for instance, a SIP or portion of a SIP. In this example, the system 600, having substrate 602 and universal matrix 660, is provided with additional details. For instance, the universal connection matrix 660 is illustrated with a circuit as depicted in FIG. 2, combined with an array periphery as described with respect to FIG. 5. In this example, active circuits 701, 706 are attached along with passives 703 and others, and interconnected using bond wires such as 704 and others. Additionally, the circuits are connected to power 705, ground 712, input and output pads and/or pins 711, and other devices on the substrate 602 using connection pads 702 and 713.

Figure 7B:
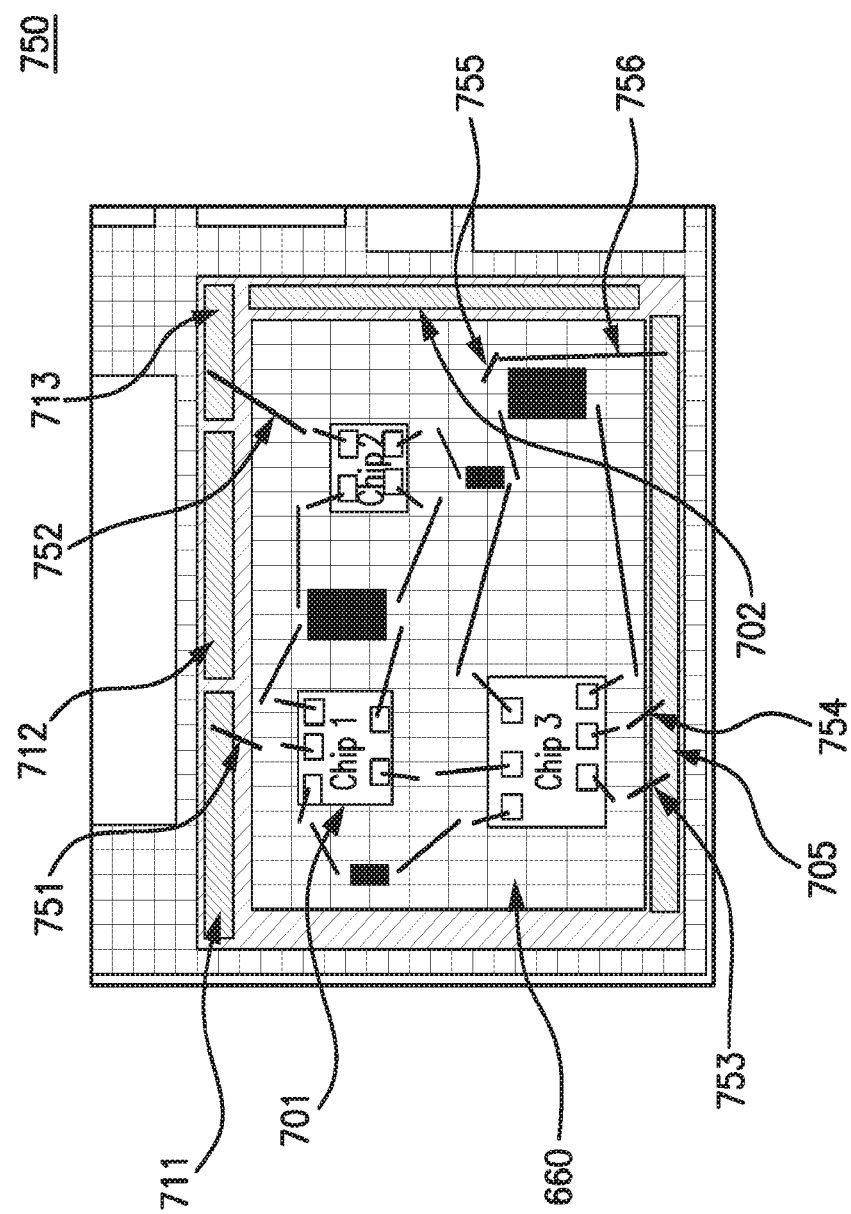

Referring now to FIG. 7B, FIG. 7B illustrates an enlarged view 750 of substrate 602 with universal substrate 660 connected to it, as shown in FIG. 7B. In this example, the interface areas 711, 713, 705 and 702 are used. For instance, bond wires 751, 752, 753, 754, 755 and 756 are used to connect the selected components attached to substrate 660 to the interface areas 711, 713, 702 and 705 of substrate 602. The interface areas of 660 can provide external connections for the matrix. According to some embodiments, the interface areas may or may not be segmented into multiple unique electrical connections to the substrate 602. Further, if the universal connection matrix 660 is physically part of the substrate 602, the interface areas 711, 712, 713, 705 and 702 can be electrically connected to the various power, ground and signals of the substrate 602. These interface areas may have the wire bond connections as shown in FIG. 7b (751 752, 753, 754, 755, 756) or, in the case where the universal connection matrix 660 is an independent substrate, it may use electrical pins for mounting on the substrate 602 or have a ball grid array for connection to the substrate 602.

According to some embodiments, the universal connection matrix 660 may be designed as part of the substrate 602 or be an independent component to be attached to the substrate 602 using bond wires, pins, ball grid arrays or other means of electrical and mechanical attachment.

Figure 7C:
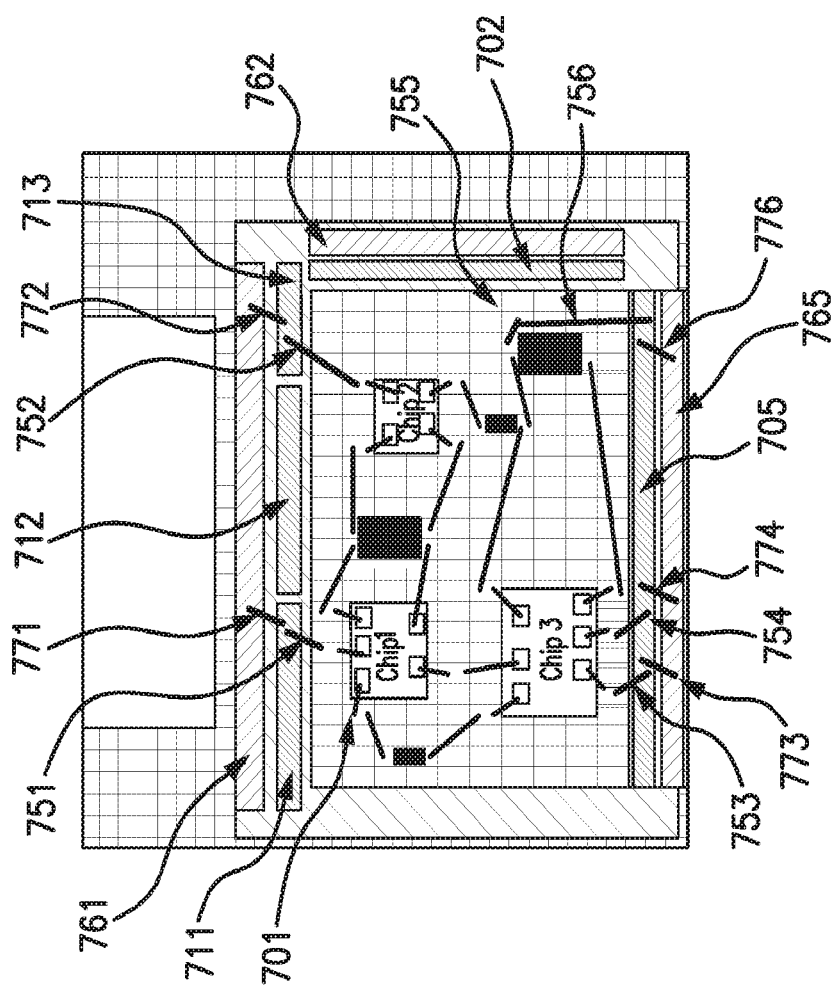

Referring now to FIG. 7C, a universal connection matrix 660 is depicted as a component attached to the substrate 602, for instance, as part of a SIP. In this example, the substrate 602 is designed with connection elements 761, 765 and 762 incorporated as part of its design. These connections elements can be landing pads for bond wires, pads for leads attached to the universal connection matrix, and/or pads arranged to accept an array of balls. According to some embodiments, the universal connection matrix includes a set of landing pads 711, 712, 713, 702, 705 for which the circuitry attached to the matrix is connected using bond wires 751, 752, 753, 754, 756. In certain aspects, once the connection matrix 660 is physically attached to the substrate 602, further bond wire connections are made from the matrix landing pads to the substrate landing pads 761, 765, 762. With these connections in place, the universal connection matrix 660 is electrically connected to the substrate 602. According to some embodiments, the systems described with respect to FIGS. 6 and/or 7A-7C can be encapsulated to form a package, for instance, as described with respect to FIGS. 9 and 13.

According to some embodiments, a substrate for a SIP is provided, having a surface, wherein the surface has a portion covered with spaced apart electrically conductive landing pads for electrical connection to components mounted on the surface and the landing pads serve as interconnection pads for making electrical connections between at least a portion of the pads associated with components when electrically connected together, and having multiple spaced apart conductive layers to provide conductors in specific patterns of unique conductive routing lines or configurations within each conductive layer and vias for interconnections between layers and pads to operatively or electrically interconnect the different components, such as 610, 612, 614, 620, 622, 630, 640, 650, 652 and 654 on the SIP substrate. These conductive layers also can provide electrical interconnection to pads 711, 712, 713 and 705 allowing the components attached to the universal substrate to be electrically interconnected to the other components on the SIP system substrate. The universal substrate may either be a second substrate attached to the SIP system substrate as a component, or be included as portion of the constructions on the surface portion of the SIP system substrate for mounting components.

According to some embodiments, a universal substrate is provided to create a desired system on a SIP having desired functionalities. More particularly, the multiple components needed for a desired system may be mounted on an a connection matrix of the universal substrate of the present disclosure. The actual operative interconnections needed to make the components mounted on a substrate to make up a system and perform the desired functionality of a that system is made by the interconnections between components mounted on a substrate using these conductive layers, when those layers are present, component interconnections using landing pads, and pad and/or component interconnections with system external connectors. That is, these interconnections can be made in functional relationship to the components mounted on the substrate and the desire system functionality. Those components may then be operatively interconnected using bond wires or other direct connection means, and depending on the embodiment, link interconnections are made in combination with circuitization.

Figure 8:
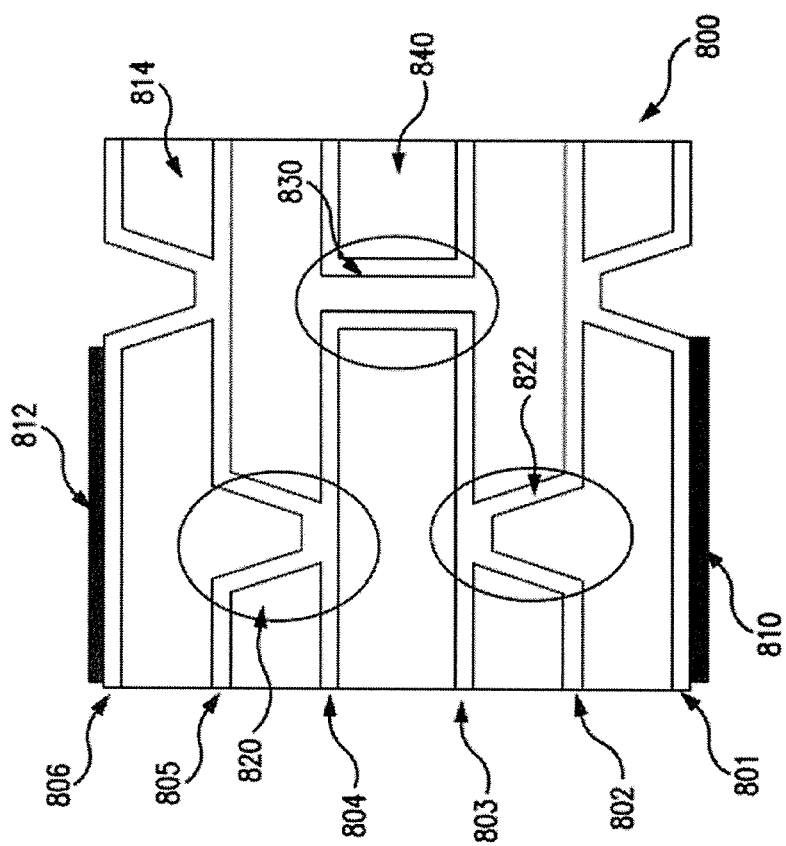
FIG. 8 is a cross section of a substrate in accordance with some embodiments.

Referring now to FIG. 8, a cross section 800 of a portion of a substrate according to certain embodiments is shown. According to some embodiments, the base layer of a substrate, such as the substrates described with respect to the preceding figures, may have the structure illustrated in FIG. 8. It may have, for example, six conductive layers. The six conductive layers 801, 802, 803, 804, 805, 806 are spaced apart by nonconductive materials 814, which may be a nonconductive resin. In FIG. 8, the conductive layers may be copper, but any conductive material may be used, and the nonconductive materials may be resin, but any nonconductive material may be used. A structural base layer 840 and others may be added above and below a base layer, and may be thinner than the base layer. Similarly, multiple vias 820, 822, 830 are depicted and can be located in the signal layer or other layers in appropriate locations spaced on the plane of the layer needed to accomplish the required interconnections. In addition, solder layers 810 and 812 may be used. These layers may be, for example, part of a universal connection matrix or external connector.

Figure 9:
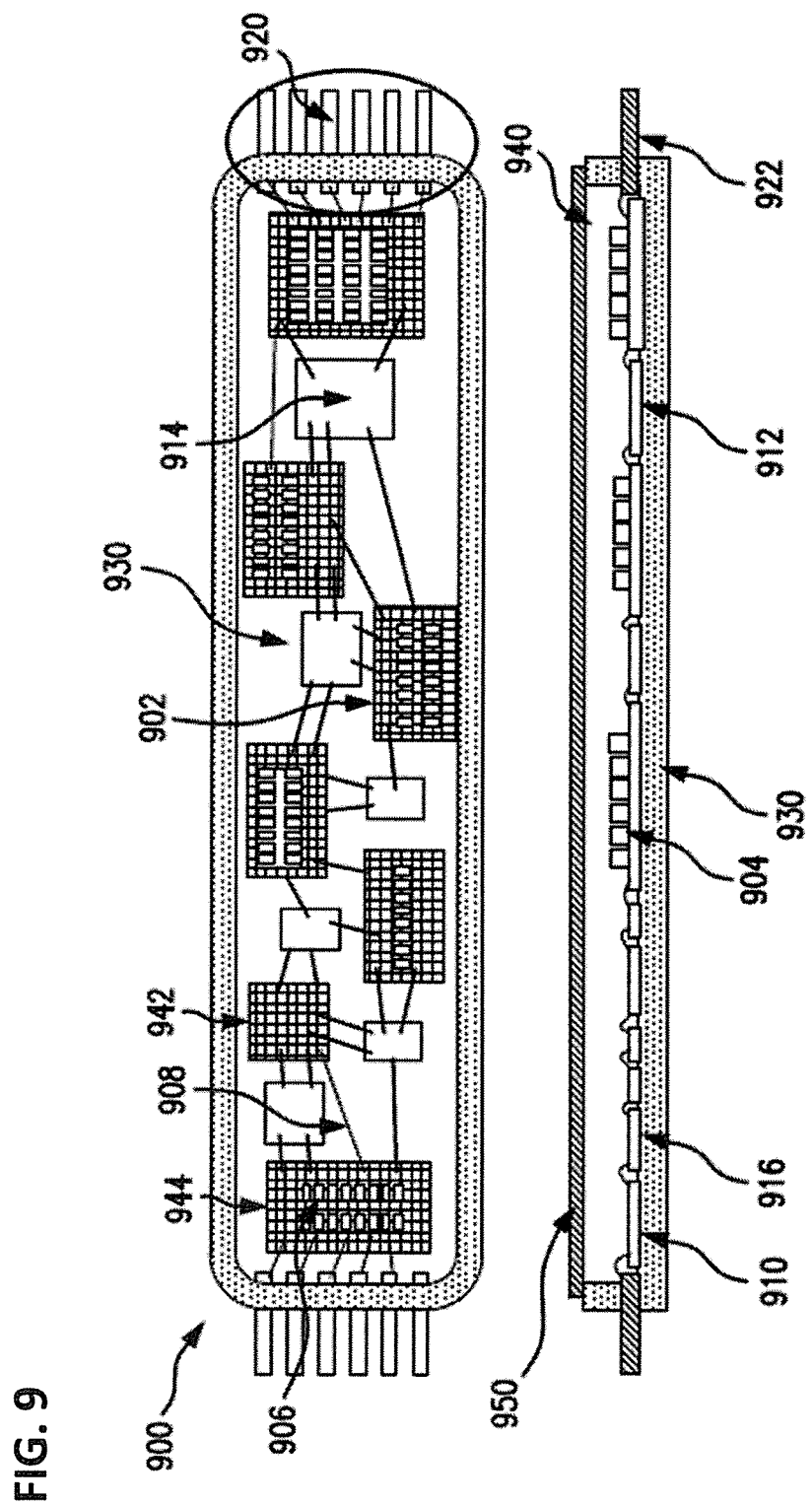
FIG. 9 is a diagram of a system in accordance with some embodiments.

Referring now to FIG. 9, two views of a SIP 900 using a plurality of small interconnection matrices are shown, in an overview and a cross-sectional side view. In this embodiment, the substrate 930 may have no circuitization. It is, for example, a blank ceramic or metal substrate, though other embodiments may employ multiple conductive layers and circuitizations. In this example, the interconnection between active devices 914 and passive components 904 is accomplished by a set of interconnection "thumbnail" matrix panels 902, 942, 944, which may have predetermined conductive patterns and form a matrix interconnection system. These panels may be small pieces of a PCB with the matrix pads and interconnections similar to those in other embodiments. In certain aspects, the panels may be on a much smaller scale, and can be attached to the substrate alongside other devices and passive components may be attached on the surface of these panels according to the specific requirement of the specific system. Each of the pre-circuitized "thumbnail" matrix panels 902, 942, 944 contains conductors on their surface, and when required, optionally in substrate layers below. These conductors can be further customized through bonding wires that can be bonded on the pre-existing arrays of pads, one example of which is pad 906. External leads 920 are also shown. A wire bond 908 interconnects two separate matrix pads, one in matrix 942 and one in matrix 944.

Further referring to FIG. 9, there may be seen a cross section of the SIP 900. Depicted are the top 950 of the package 900 containing the SIP and a cross section 922 of the leads 920. Also, 940 depicts the open area between the components and substrate and the top 950 of the package 900. Elements 912 and 916 are cross sections of an active device or component and 904 is a cross section of a passive device or component located on the surface of a matrix panel. Element 910 is a cross section of a panel 944, which may have passives on its surface. Element 930 may serve as both the package base and the substrate. According to certain aspects, the conductor pattern on the surface of each matrix panel (and in any conductive layers below the surface) 902, 942, 944 may be arranged such that their configuration can be changed to accommodate different devices. This customization ability is attained through wire bonding on the surface of a matrix panel between and within arrays of pads or terminals on the surface of each matrix panel which are amenable to different interconnecting schemes. Thus a single substrate can be used for multiple SIPs thereby reducing the time and expense of designing a new substrate. A co-pending application, PCT/US2016/050157, which was filed Sep. 2, 2016, and is titled Improved System Using System In Package Components, is directed to SIPs and programmable systems made from electrical components on SIP substrates.

Figure 10:
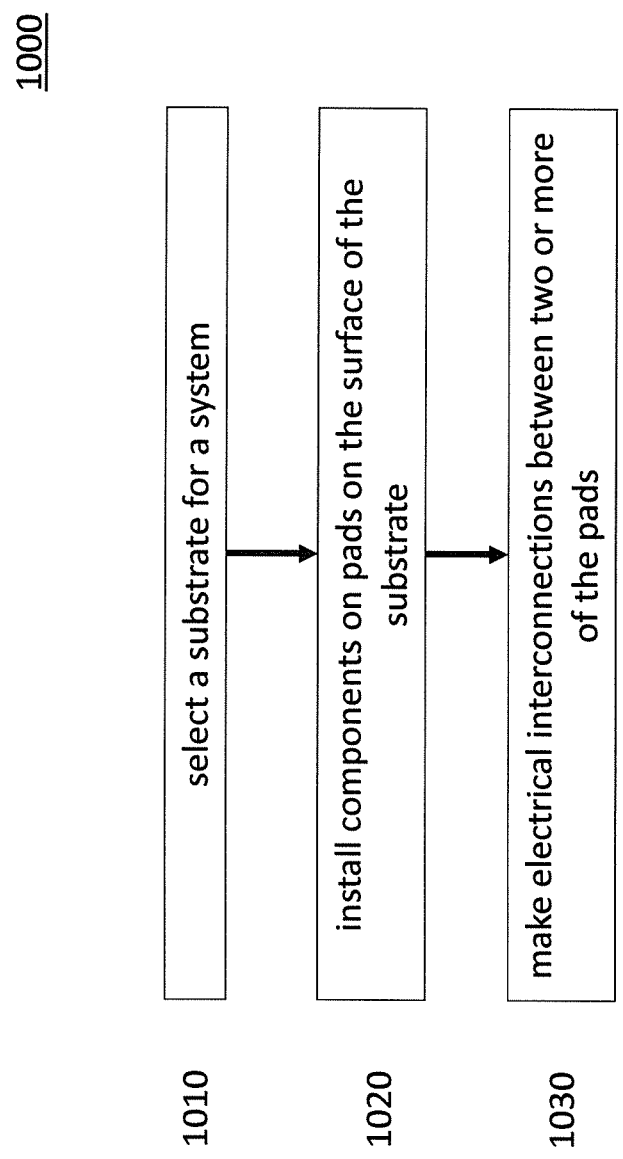
FIG. 10 is a flow chart illustrating a process according to some embodiments.

Referring now to FIG. 10, according to some embodiments, a process 1000 for assembling a system, e.g., a SIP, is provided. The process may begin, for instance, with step 1010 in which a substrate for the system is selected. The substrate may be, for instance, a substrate as set forth in one or more of FIGS. 2-7. For instance, the substrate can include a connection matrix comprised of a plurality of pads. In some embodiments, the pads cover the majority of the top surface of the substrate. In step 1020, one or more components are installed on the substrate using the pads of the connection matrix. For instance, the pads of the connection matrix can be used as landing pads for one or more devices as illustrated with respect to FIGS. 2 and 3. In step 1030, electrical interconnections are made between two or more of the pads of the connection matrix, including between at least one of the pads on which a component is mounted and another of the pads. This may be, for instance, as illustrated with respect to FIGS. 7A-7C, in which chips and other devices mounted on the matrix 660 are interconnected.

Figure 11:
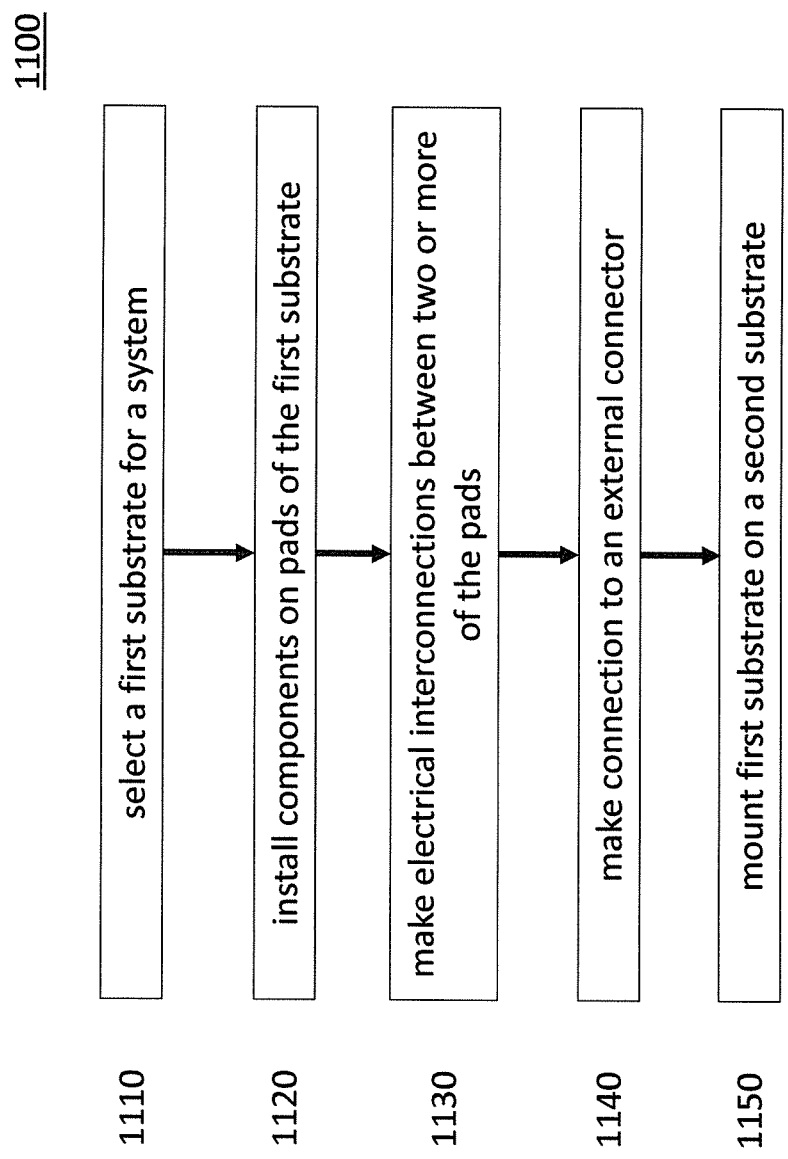
FIG. 11 is a flow chart illustrating a process according to some embodiments.

Referring now to FIG. 11, according to some embodiments, a process 1100 for assembling a system, e.g., a SIP, provided. The process may begin, for instance, with step 1110 in which a first substrate for the system is selected. The first substrate may be, for instance, a substrate as set forth in one or more of FIGS. 2-7. For instance, the substrate can include a connection matrix comprised of a plurality of pads. In some embodiments, the pads cover the majority of the top surface of the substrate. In step 1120, one or more components are installed on the first substrate using the pads of the connection matrix. For instance, the pads of the connection matrix can be used as landing pads for one or more devices as illustrated with respect to FIGS. 2 and 3. In step 1130, electrical interconnections are made between two or more of the pads of the connection matrix, including between at least one of the pads on which a component is mounted and another of the pads. This may be, for instance, as illustrated with respect to FIGS. 7A-7C, in which chips and other devices mounted on the matrix 660 are interconnected. In step 1140, connections are made between one or more of the pads and external connectors. For instance, as illustrated with respect to FIGS. 7B and 7C, connections can be made using power 705, ground 712, input and output pins 711 of the first substrate. In step 1150, the first substrate is mounted on a second substrate. This mounting may include, for instance, making electrical connection between the components on the first substrate and the second substrate. For example, connectors, such as 705, 712, and 711 can be connected to the second substrate using bond wires. Also, a ball grid array could be used to provide connection between the first and second substrate, for instance, if the first substrate has a ball grid connect as described with respect to FIG. 13.

According to some embodiments, the process 1100 further includes encapsulating the first and second substrates to form a package. This may be, for instance, where the system is a SIP-type system.

Figure 12:
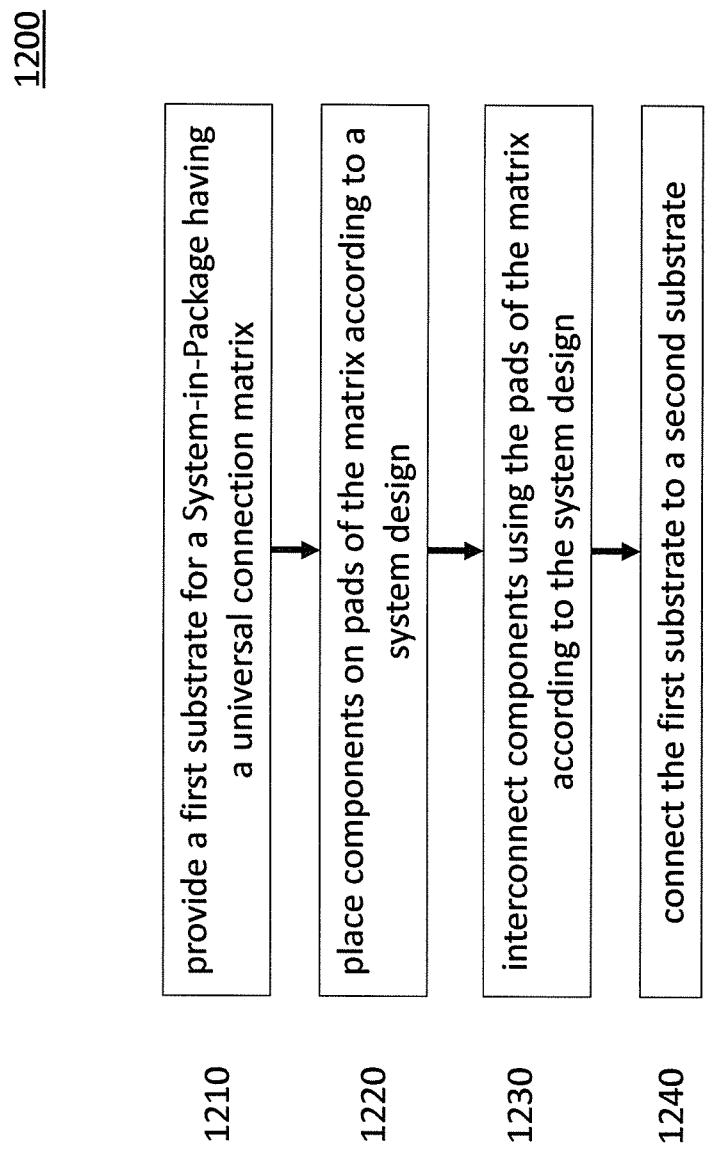
FIG. 12 is a flow chart illustrating a process according to some embodiments.

Referring now to FIG. 12, according to some embodiments, a process 1200 for customizing a system, e.g., a SIP, during assembly is provided. The process may begin, for instance, with step 1210 in which a first substrate for the system is provided, where the first substrate has a universal connection matrix. For example, the first substrate may be a substrate as set forth in one or more of FIGS. 2-7 and having a connection matrix comprised of a plurality of pads. In some embodiments, the pads cover the majority of the top surface of the substrate. In step 1220, one or more components are placed on the first substrate using the pads of the connection matrix. According to embodiments, the components are placed on the pads of the connection matrix according to a particular system design. In some embodiments, the process 1200 may include a step of selecting a system design having preselected components placements for said plurality of components, where the system design defines interconnections for the plurality of components to determine the functionality of said SIP. In step 1230, the components are interconnected using the pads of the matrix and according to the system design. This may be, for instance, as illustrated with respect to FIGS. 7A-7C, in which chips and other devices mounted on the matrix 660 are interconnected. The particular interconnections, as well as the particular components used, may define the desired system functionality, as set forth in the system design. In step 1240, the first substrate is mounted on a second substrate. This mounting may include, for instance, making electrical connection between the components on the first substrate and the second substrate. For example, connectors, such as 705, 712, and 711 can be connected to the second substrate using bond wires. Also, a ball grid array could be used to provide connection between the first and second substrate, for instance, if the first substrate has a ball grid connect as described with respect to FIG. 13.

According to some embodiments, the second substrate also has a connection matrix, for instance, covering a majority of its top surface. In this example, the first substrate may be mounted on the connection matrix of the second substrate. Additionally, and in some embodiments, the first and second substrates may be encapsulated together to form a single package.

Figure 13:
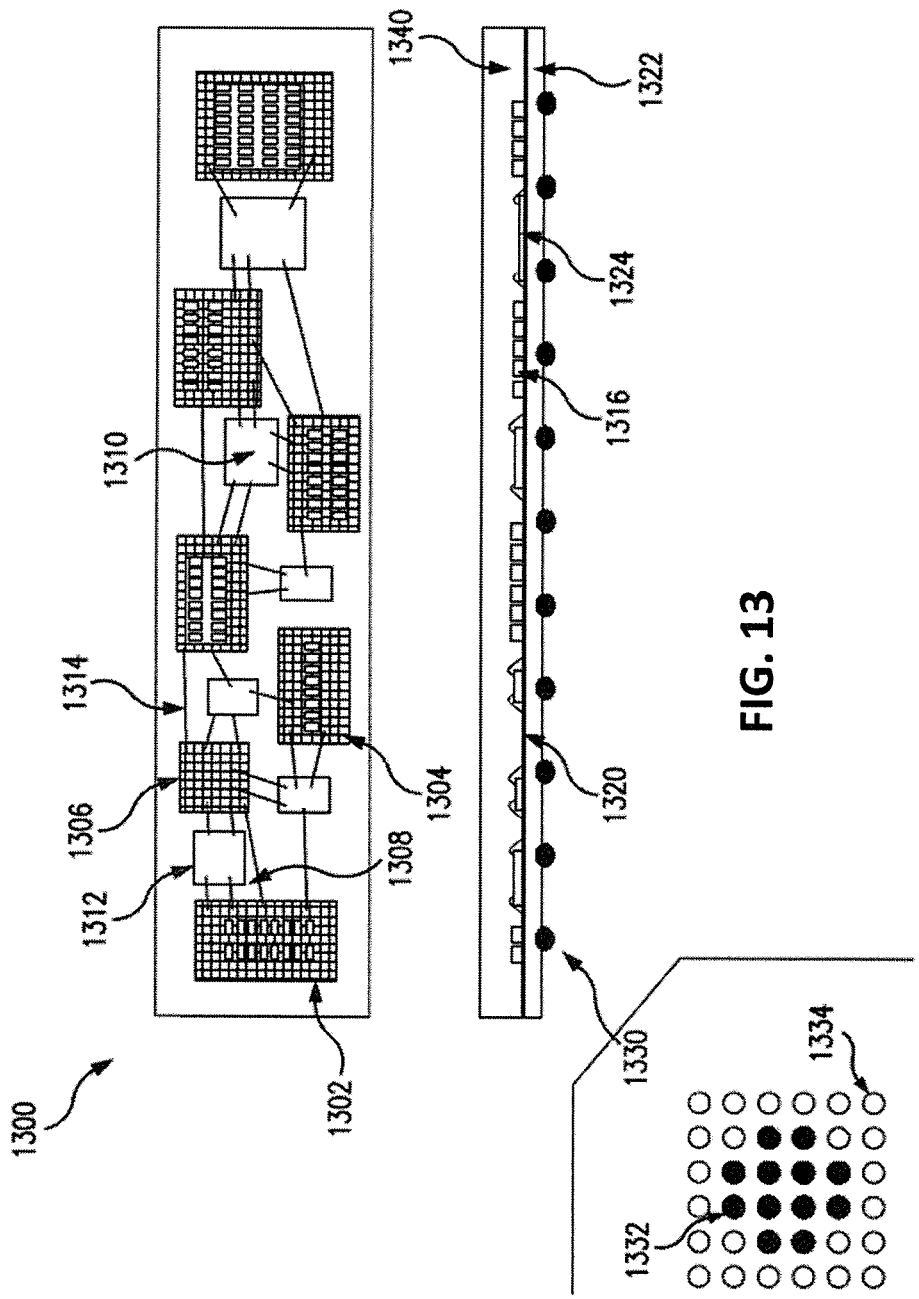
FIG. 13 is a diagram of a system in accordance with some embodiments.

Referring now to FIG. 13, three views of a SIP 1300 using a plurality of small matrix interconnections and a PCB base are shown in an overview, a cross-sectional side view, and an enlarged partial bottom view. In the embodiment of FIG. 13, the substrate 1322 is made of plastic laminate material which may contain two or more conductive layers that form a fixed circuitization, with interconnection matrices 1302, 1304, 1306, which allow for interconnections that can be further customized through bonding wires that can be bonded on the pre-existing arrays of pads on each interconnection matrix, e.g. using pads on the surface of each interconnection matrix. According to certain aspects, high temperature tolerant substrate, encapsulant and other materials can be used to make the package rugged. External connections can be made using balls 1330 located on the bottom of the substrate 1322. The interconnection between active devices 1310, 1312 and passive components can be accomplished by a set of interconnection matrices 1302, 1304, 1306, which have predetermined conductive patterns and form the matrix interconnection system of the present disclosure, and through the standard interconnections available in the PCB circuitization layer 1322 that are available to be used by individual components and/or the interconnection matrices. According to certain aspects, each of the interconnection matrices 1302, 1304, 1306, may be provided as conductors on the surface in addition to the standard circuit interconnections available in the standard circuitization layer 1322. These interconnections can be further customized through bonding wires that can be bonded on the pre-existing arrays of pads on each interconnection matrix, e.g. using pads on the surface of each interconnection matrix. A wire bond 1308 interconnects two separate interconnection matrix pads, one in interconnection matrix 1302 and one in interconnection matrix 1306; also depicted is wire bond 1314 that interconnects two separate interconnection matrix pads, one in interconnection matrix 1306 and one in another interconnection matrix. According to some embodiments, the substrate is made of plastic laminate material which contains two or more conductive layers which form the PCB circuitization, and a metal plate may be attached as a heatsink at the bottom using non-electrically conducting but thermally conducting interface material. Additionally thermal vias are strategically placed to dissipate head from components that need cooling.

Further referring to FIG. 13, a cross section of the SIP 1300 is shown, and 1340 depicts the plastic compound forming the SIP package. In certain aspects, it depicts the package 1300 containing the components and substrate and the plastic compound 1340. Element 1324 is a cross section of an active device or component and 1316 is a cross section of passive devices or components located on the surface of a matrix panel. Element 1320 is a cross section of a multilayered PCB tape. High temperature molding compound can used to embed the high temperature PCB substrate 1322 and its components.

According to certain embodiments, the SIP substrate 602 (e.g., formed as a PCB) may have multiple, insulatingly spaced apart, conductive layers which may be etched or otherwise created to provide electrical conductors in specific patterns of unique conductive routing lines or configurations within each conductive layer and vias for interconnections between layers and pads; these patterns may be used to at least partially interconnect the different components on the SIP substrate which may include, but are not limited to, semiconductor devices, passive electrical components, other devices, and universal substrates. Alternatively, these patterns may also be used to at least partially interconnect the different components on a universal substrate and to connect with portions of the SIP substrate on which the universal substrate may be located. The actual operative connections needed to make the components on a substrate make up a system and perform the desired functionality of a that system is made by the interconnections between components mounted on a substrate using these conductive layers when those layers are present, component interconnections using landing pads, and pad and/or component interconnections with external connectors; that is, these connections are made in functional relationship to the components mounted on the substrate and the desired system functionality. Alternatively, for some embodiments, the universal substrate may be a standalone substrate having no layers for use in a SIP. For other embodiments, the universal substrate has one or more portions populated with a matrix of pads and the remainder of the substrate may be a conventional substrate.

According to certain embodiments, for a SIP, the circuitization in the SIP substrate interconnects components to the pads of the universal matrix allowing for different electrical interconnectivity schemes, such as for example, but not limited to using bond wire patterns. The wire bond patterns depend on the components located on the substrate and the desired functionality and features of the system that the substrate is intended to provide, once all the components are mounted on the substrate and properly connected.

In certain aspects, the substrate/PCB may also be constructed in a flexible manner in the form of a multi-layered film or tape having fixed, predetermined ("hard-wired") conductive patterns of conductive routing lines and vias for making electrical interconnections in and between each layer. That is, these conductive patterns can make "hard-wired" interconnections between the components as also described herein. These patterns may interconnect with components using vias connected to a portion of the pattern. And, these patterns may interconnect with components using vias connected to a pad connected to or associated with a component. In addition, some portions or pads of a universal matrix may be hard-wired using portions of these same conductive patterns. In this instance, the remaining needed connections may be completed using the universal matrix on the SIP substrate or the universal substrate with a predetermined pattern of bond wires between pads to create the component and other needed interconnections to form a desired system.

According to some embodiments, a method is provided for assembling an integrated circuit using a SIP substrate, by providing a circuit diagram/schematic having preselected components with identified interconnections for a desired integrated circuit and then selecting a first substrate having multiple component locations with associated component connection pads and at least one universal connection matrix having pads uniquely associated with the component connection pads on which the circuit is to be fabricated. In certain aspects, each of the components is mounted on its unique component location on the first substrate and then each of the components is connected with the component connection pads of its component location. The components on the first substrate are interconnected using bond wire between appropriate pads of the universal connection matrix. In some embodiments, a second substrate is provided that may be substantially a matrix of interconnection pads for placing selected components thereon and for interconnecting those selected components to part of the circuit and then operatively interconnecting the second substrate to the first substrate to form the circuit.

According to some embodiments, the required system customization, which is may be defined by a system's unique preselected interconnecting scheme, is done during assembly by creating appropriate preselected links with wire bonds (or other means) on the surface of each universal substrate matrix that is strategically placed on the surface of the SIP substrate and may have been previously left intentionally open or not connected. These pads that are left "open" are for the purpose of being able to make multiple, different and unique customized wire bond (link) patterns depending upon the mounted system components and universal substrate actually used in a system and that system's application(s). These wire bond links may be changed as required by a system's design just prior to assembly and packaging. According to some embodiments, the SIP substrate may also have multiple conductive layers for interconnection of different portions of circuits and/or components and/or pads on their surface, in addition to the bond wires on the surface, to handle the power rails and other common interconnections. In certain aspects, this may allow for changeable interconnections to be made on the surface layer and fixed interconnections may be embedded in the layers of the substrate. For some embodiments, the wire bond links may act as additional layers of the substrate, thus reducing the number of conductive layers within a substrate. The wire bond links can provide the flexibility to configure or program the substrate and the associated components for a new system implementation, but using the same components connected in a different circuit configuration as a result of the different wire bond links.

Figure 14:
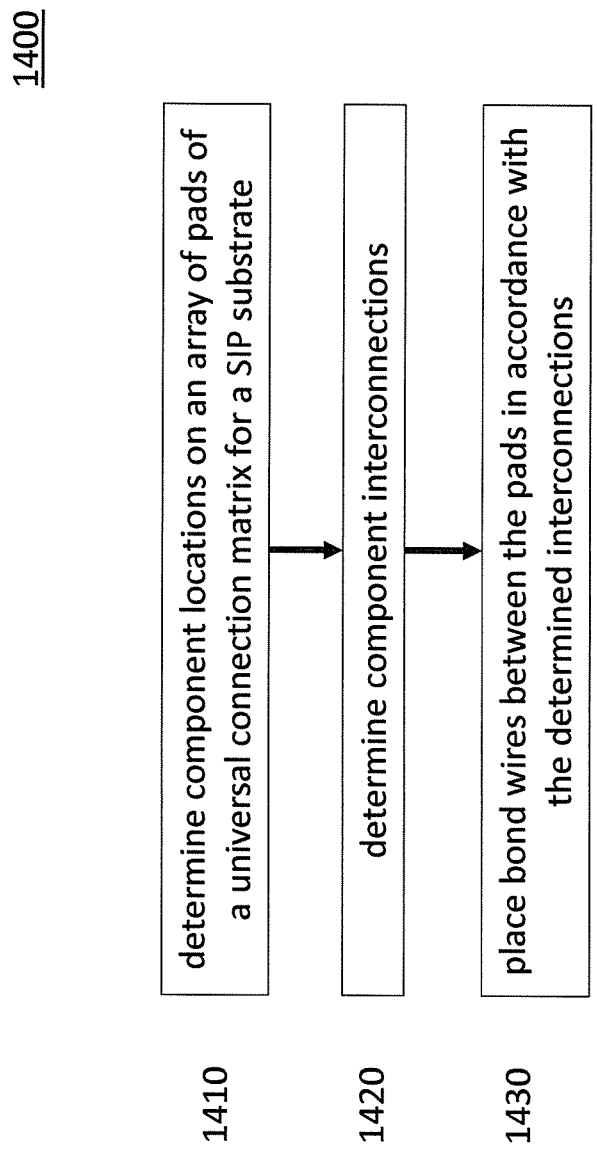
FIG. 14 is a flow chart illustrating a process according to some embodiments.

Referring now to FIG. 14, an embodiment of the present disclosure provides a method 1400 for customizing wire bond interconnections for an integrated circuit assembled on a SIP substrate. As part of assembly for an integrated circuit, a method for customizing wire bond interconnections for a programmable circuit assembled on a SIP substrate that includes a universal matrix is provided. The method establishes component locations and component connection pad locations on the SIP substrate. In step 1410, component locations on an array of connection pads of a universal matrix disposed on a portion of the surface of the SIP substrate are determined. In step 1420, interconnections between selected connection pads of the universal matrix based on component interconnections to the connection pads of the universal matrix and interconnections to the component connection pads on SIP substrate are determined. In step 1430, bond wires are placed between the pads on the universal matrix and the SIP substrate in accordance with the determined interconnections.

While the present disclosure has been described with respect to the embodiments set forth above, the present disclosure is not necessarily limited to these embodiments. Accordingly, other embodiments, variations, and improvements not described herein are not excluded from the scope of the present disclosure. Such variations include but are not limited to new substrate material, different kinds of devices, not discussed, but well known in the semiconductor art that may be attached to a substrate, or new packaging concepts that may be employed. Although the present disclosure and its advantages have been described in detail, it should be understood that various changes, substitutions and alterations can be made herein without departing from the spirit and scope of the disclosure as defined by the appended claims.

What is claimed is:

1. A system comprising:
a first substrate having a top surface;
a first connection matrix on said top surface, wherein said first connection matrix comprises a plurality of individually isolated and spaced apart electrically conductive pads;
one or more external connection elements on said top surface comprising at least one of ground, power, input, and output pads electrically isolated from the pads of said connection matrix;
one or more circuit components mounted on at least a first of said pads of said connection matrix;
one or more bond wires that provide electrical connections between at least said first pad and a second of said pads of said connection matrix;
one or more bond wires that provide an electrical connection between said second pad and said one or more external connection elements; and
a second substrate, wherein said first substrate is electrically connected to and mounted on said second substrate,
wherein said first connection matrix covers a majority of said top surface of the first substrate, and
wherein said first and second substrates are electrically connected with said one or more external connection elements.

2. The system of claim 1, wherein said second substrate comprises a second connection matrix comprising a plurality of individually isolated and spaced apart electrically conductive pads, wherein said first substrate is electrically connected to and mounted on said second substrate using said second connection matrix.

3. The system of claim 1, wherein said system is a System in a Package (SIP), further comprising:
an encapsulant layer.

4. The system of claim 1, wherein said first connection matrix covers at least 75% of said top surface of said first substrate.

5. The system of claim 1, wherein said one or more external connection elements are located along an outside edge of said first substrate.

6. The system of claim 1, wherein said one or more external connection elements comprise a ball grid array.

7. The system of claim 1, wherein said first connection matrix on said top surface is the only conductive layer of said first substrate.

8. The system of claim 2, wherein said second connection matrix covers a majority of a top surface of said second substrate.

9. The system of claim 8, wherein said second connection matrix covers at least 75% of said top surface of said second substrate.

10. A method for assembling a system, comprising:
- selecting a first substrate for said system, wherein said first substrate comprises a first connection matrix of a plurality of spaced apart individual electrically conductive pads on a top surface of said first substrate, wherein said first connection matrix covers a majority of said top surface of the first substrate, and wherein said first substrate comprises one or more external connection elements on said top surface comprising at least one of ground, power, input, and output pads electrically isolated from the pads of said first connection matrix;
- installing a first set of components for said system on said pads of the first connection matrix;
- making electrical interconnections between two or more of said pads of the connection matrix;
- selecting a second substrate for said system, wherein said second substrate comprises a second connection matrix of a plurality of spaced apart individual electrically conductive pads;
- mounting said first substrate to said second substrate and electrically connecting the first and second substrates; and
- connecting one or more bond wires to provide electrical connections between at least one pad of said first connection matrix and said one or more external connection elements.

11. The method of claim 10, further comprising:
- making electrical connections between two or more of said pads of said first connection matrix and said one or more external connection elements.

12. The method of claim 10, wherein said first connection matrix covers at least 75% of said surface of said first substrate.

13. The method of claim 10, further comprising:
- installing a second set of components on areas on said surface of said first substrate that do not include said connection matrix; and
- making operative electrical connections between said first and second set of components.

14. The method of claim 10, wherein said system is a System in a Package (SIP), further comprising:
- encapsulating said first and second substrate.

* * * * *